US010522989B2

(12) United States Patent
Ikeda et al.

(10) Patent No.: US 10,522,989 B2
(45) Date of Patent: Dec. 31, 2019

(54) CASING, ELECTRICAL CONNECTION BOX, AND WIRE HARNESS

(71) Applicant: YAZAKI CORPORATION, Tokyo (JP)

(72) Inventors: Tatsuhiko Ikeda, Makinohara (JP); Takaaki Kakimi, Makinohara (JP); Ko Fujimoto, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/374,032

(22) Filed: Apr. 3, 2019

(65) Prior Publication Data

US 2019/0348826 A1 Nov. 14, 2019

(30) Foreign Application Priority Data

May 8, 2018 (JP) ................................. 2018-089715

(51) Int. Cl.
*H02G 3/08* (2006.01)
*B60R 16/023* (2006.01)
*B60R 16/02* (2006.01)

(52) U.S. Cl.
CPC ......... *H02G 3/088* (2013.01); *B60R 16/0207* (2013.01); *B60R 16/0239* (2013.01)

(58) Field of Classification Search
CPC .. H02G 3/088; B60R 16/0207; B60R 16/0239
USPC ....................................................... 174/535
See application file for complete search history.

(56) References Cited

U.S. PATENT DOCUMENTS

| 6,561,822 | B2 * | 5/2003 | Depp | H05K 7/026 439/521 |
| 7,183,648 | B2 * | 2/2007 | Ramanathan | H01L 24/11 228/180.22 |
| 8,021,921 | B2 * | 9/2011 | Lin | H01L 24/11 438/108 |
| 8,421,225 | B2 * | 4/2013 | Ramanathan | H01L 24/11 257/737 |
| 8,785,775 | B2 * | 7/2014 | Takeuchi | B60R 16/0239 174/50 |

(Continued)

FOREIGN PATENT DOCUMENTS

| JP | 2001072116 | * | 3/2001 |
| JP | 2014-143877 A | | 8/2014 |

*Primary Examiner* — Andargie M Aychillhum
*Assistant Examiner* — Michael F McAllister
(74) *Attorney, Agent, or Firm* — Sughrue Mion, PLLC

(57) ABSTRACT

A wire harness wired to a vehicle has an electrical connection box at a terminal thereof. The electrical connection box includes an electronic component block to which a plurality of electronic components are assembled and a casing to be an assembly destination of the electronic component block. The casing has a structure in which an upper cover rotates and moves to cover an upper opening portion surrounded by an edge of a frame peripheral wall. The casing includes the frame peripheral wall having the upper opening portion, the upper cover covering the opening portion by rotational movement, and a packing to be assembled to the upper cover. The packing is assembled to a packing groove formed in the upper cover. The frame peripheral wall has a position adjusting portion for adjusting the position of the packing groove with respect to the edge of the frame peripheral wall.

8 Claims, 14 Drawing Sheets

(56) References Cited

U.S. PATENT DOCUMENTS

| | | | |
|---|---|---|---|
| 8,915,394 B2* | 12/2014 | I | H02G 3/088 220/378 |
| 9,117,825 B2* | 8/2015 | Liu | H01L 24/81 |
| 9,355,977 B2* | 5/2016 | Lin | H01L 24/06 |
| 9,462,690 B1* | 10/2016 | Darveaux | H01L 24/14 |
| 9,679,806 B1* | 6/2017 | Arvin | H01L 24/81 |
| 9,844,134 B2* | 12/2017 | Mischitz | H01L 21/288 |
| 9,876,042 B2* | 1/2018 | Yoo | H01L 27/14614 |
| 9,978,710 B2* | 5/2018 | Dubey | H01L 23/49827 |
| 2002/0084271 A1* | 7/2002 | Sato | H02G 3/088 220/3.8 |
| 2002/0180272 A1* | 12/2002 | Yuasa | B60R 16/0238 307/10.1 |
| 2008/0083549 A1* | 4/2008 | Iizuka | H02G 3/081 174/50 |
| 2010/0127012 A1* | 5/2010 | Takeuchi | H02G 3/088 220/810 |
| 2011/0198114 A1* | 8/2011 | Maeda | H01L 23/49811 174/257 |
| 2012/0097693 A1* | 4/2012 | Takeuchi | B60R 16/0239 220/810 |
| 2012/0119359 A1* | 5/2012 | Im | H01L 23/49811 257/737 |
| 2012/0186867 A1* | 7/2012 | Asai | H05K 3/387 174/262 |
| 2013/0032371 A1* | 2/2013 | Makino | H02G 3/088 174/50 |
| 2013/0140074 A1* | 6/2013 | Yang | H05K 1/115 174/266 |
| 2014/0217062 A1* | 8/2014 | Kunstmann | C23F 1/02 216/41 |
| 2014/0242374 A1* | 8/2014 | Strasser | C23C 18/1644 428/307.7 |
| 2015/0311688 A1* | 10/2015 | Kakimi | H05K 7/026 174/562 |
| 2016/0242303 A1* | 8/2016 | Maebashi | B60R 16/0238 |
| 2016/0351529 A1* | 12/2016 | Brunschwiler | H01L 24/81 |
| 2017/0207614 A1* | 7/2017 | Shiraki | H02G 3/14 |

* cited by examiner

CASING, ELECTRICAL CONNECTION BOX, AND WIRE HARNESS

CROSS-REFERENCE TO RELATED APPLICATIONS

This application is based on and claims priority under 35 USC 119 from Japanese Patent Application No. 2018-089715 filed on May 8, 2018, the contents of which are incorporated herein by reference.

TECHNICAL FIELD

The present invention relates to a casing including a frame peripheral wall having an opening portion, a cover covering the opening portion by rotational movement, and a packing assembled to the cover. The present invention also relates to an electrical connection box including the casing and an electronic component block and a wire harness.

BACKGROUND ART

An electrical connection box to be mounted on an automobile is configured to include an electronic component block and a casing for accommodating the electronic component block (for example, see Patent Document 1). The casing is configured to include a frame having a frame peripheral wall, and a cover. The cover is formed as a member that covers an opening portion surrounded by the edge of the frame peripheral wall. The casing is configured such that the opening portion is covered by rotational movement of the cover and the locking portions of the frame and the cover are fitted to each other to complete the assembly thereof protrusions are formed on the cover of the casing for rotational movement of the cover. On the frame peripheral wall, protrusion engaging portions are formed so as to be engaged when the protrusions of the cover are inserted.

PRIOR ART DOCUMENT

Patent Document

Patent Document 1: JP-A-2014-143877

SUMMARY OF INVENTION

The inventors of the present invention are considering assembling a packing on the cover in order to ensure waterproof capability and airtightness, but in a cover that rotates and moves, for example, when the cover is misaligned or the like, the center position of the packing is not necessarily pressed against the edge of the frame peripheral wall reliably, and in a case where the degree of the misalignment is large, there is a problem that securing waterproof capability and airtightness is affected.

The present invention has been made in view of the above circumstances, and an object thereof is to provide a casing capable of securing waterproof capability and airtightness. It is also an object to provide an electrical connection box including the casing in a configuration thereof and a wire harness.

In order to solve the above problem, a casing of the present invention according to a first aspect includes a frame peripheral wall on which an opening portion is formed at an edge; a cover that covers the opening portion by rotational movement; and a packing that is assembled in a packing groove to be formed in the cover and is pressed against the edge during the rotational movement. A position adjusting portion for adjusting a position of the packing groove with respect to the edge is formed on the frame peripheral wall.

According to the present invention having the above features of the first aspect, since the position of the packing groove of the cover with respect to the edge of the frame peripheral wall is adjusted, for example, the center position of the packing assembled in the packing groove may be reliably pressed against the edge of the frame peripheral wall. Therefore, according to the present invention, it is possible to ensure waterproof capability and airtightness.

In the casing of the present invention according to a second aspect, the frame peripheral wall includes an outer peripheral wall having the edge and an inner peripheral wall to be disposed inside the outer peripheral wall, and a connecting portion that connects an inner surface of the outer peripheral wall and an outer surface of the inner peripheral wall with a space therebetween, and the position adjusting portion is disposed and formed so as to be continuous to an end portion of the connecting portion and the inner surface of the outer peripheral wall.

According to the present invention having the above features of the second aspect, since the position adjusting portion of the above disposition is provided, it is possible to form the position adjusting portion without complicating the structure of the molding die.

Further, in the casing of the present invention according to a third aspect, the position adjusting portion is formed in a rib shape extending from the connecting portion toward the edge, and a taper as a guide portion is formed at a tip end thereof.

According to the present invention having the above features of the third aspect, since the rib-shaped position adjusting portion is provided, it is possible to ensure waterproof capability and airtightness by adding a small amount of resin material. Since the cover side may be smoothly guided by the taper at the tip, workability may be improved.

Moreover, in the casing of the present invention according to a fourth aspect, the position adjusting portion is disposed and formed in accordance with the positions of a frame-side locking portion as a fitting portion of the frame peripheral wall and a cover-side locking portion as a fitting portion of the cover.

According to the present invention having the above features of the fourth aspect, since the position adjusting portion of the above disposition is provided, the position of the packing groove of the cover with respect to the edge of the frame peripheral wall may be adjusted even if the cover is affected by the fitting (for example, when the other locking portion is about to climb over one locking portion, in a case where the force due to the elastic deformation acts on the displacement direction of the cover). Therefore, for example, the center position of the packing to be assembled in the packing groove may be reliably pressed against the edge of the frame peripheral wall, thereby ensuring waterproof capability and airtightness.

Furthermore, in the casing of the present invention according to a fifth aspect, the frame-side locking portion is formed in a protruding shape protruding outward, the cover-side locking portion is formed in a substantially U-shaped frame shape to be locked by climbing over the frame-side locking portion in the protruding shape at the time of the rotational movement, and a locking surface of the frame-side locking portion is formed in a shape inclined with respect to a locked surface of the cover-side locking portion so that a gap increases from a tip end to a base end of the frame-side locking portion.

According to the present invention having the features of the fifth aspect, since the locking surface of the frame-side locking portion and the locked surface of the cover-side locking portion do not slidably contact to each other, it is possible to reduce the frictional resistance when the cover-side locking portion elastically returns. Therefore, the cover-side locking portion may be elastically returned at once, and as a result, it is possible for an operator to recognize that the engagement is reliably performed by generating a large fitting sound. If it is recognized that the engagement is reliably performed, it is possible not only to improve workability but also to improve reliability by preventing half fitting. The operation of the position adjusting portion in the fifth aspect will be described in detail in the section of Example.

Further, in order to solve the above problem, an electrical connection box of the present invention includes an electronic component block to which a plurality of electronic components are assembled; and the casing described above to be an assembly destination of the electronic component block.

According to the present invention having the above features, the effect of the casing may be obtained, and as a result, it is possible to provide a better electrical connection box.

Furthermore, in order to solve the above problem, a wire harness of the present invention includes the electrical connection box described above, and is arranged in a vehicle.

According to the present invention having the above features, it is possible to provide a better wire harness which ensures waterproof capability and airtightness of the electrical connection box.

According to the casing of the present invention, it is possible to ensure waterproofness and airtightness. According to the electrical connection box and the wire harness of the present invention, it is possible to provide a better product.

BRIEF DESCRIPTION OF DRAWINGS

FIG. 5A is a perspective view, FIG. 5B is a perspective view of a frame-side locking portion, and FIG. 5C is a perspective view of a cover-side locking portion;

FIG. 7A is a view seen from the arrow C of FIG. 6, and FIG. 7B is a view seen from the arrow D of FIG. 6;

DESCRIPTION OF EMBODIMENTS

A wire harness wired to a vehicle has an electrical connection box at a terminal thereof. The electrical connection box is configured to include an electronic component block to which a plurality of electronic components are assembled and a casing to be an assembly destination of the electronic component block. The casing has a structure in which a cover rotates and moves to cover an opening portion surrounded by an edge of a frame peripheral wall. The casing is configured to include a frame peripheral wall having an opening portion, a cover covering the opening portion by rotational movement, and a packing to be assembled to the cover. The packing is assembled to a packing groove formed in the cover. The frame peripheral wall has a position adjusting portion for adjusting the position of the packing groove with respect to the edge of the frame peripheral wall.

EXAMPLE

Figure 1:
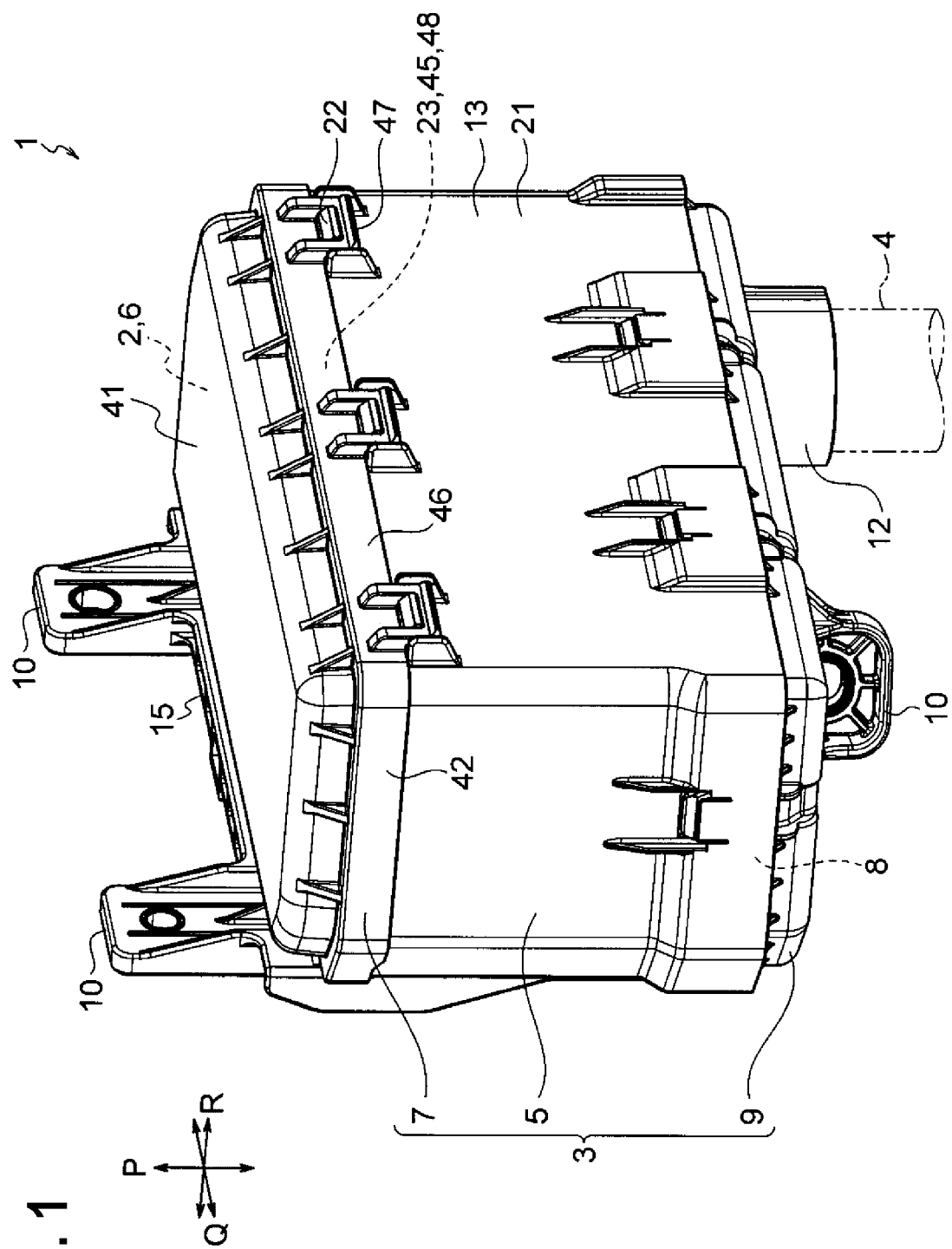
FIG. 1 is a perspective views illustrating an embodiment of an electrical connection box including a casing of the present invention.
Figure 2:
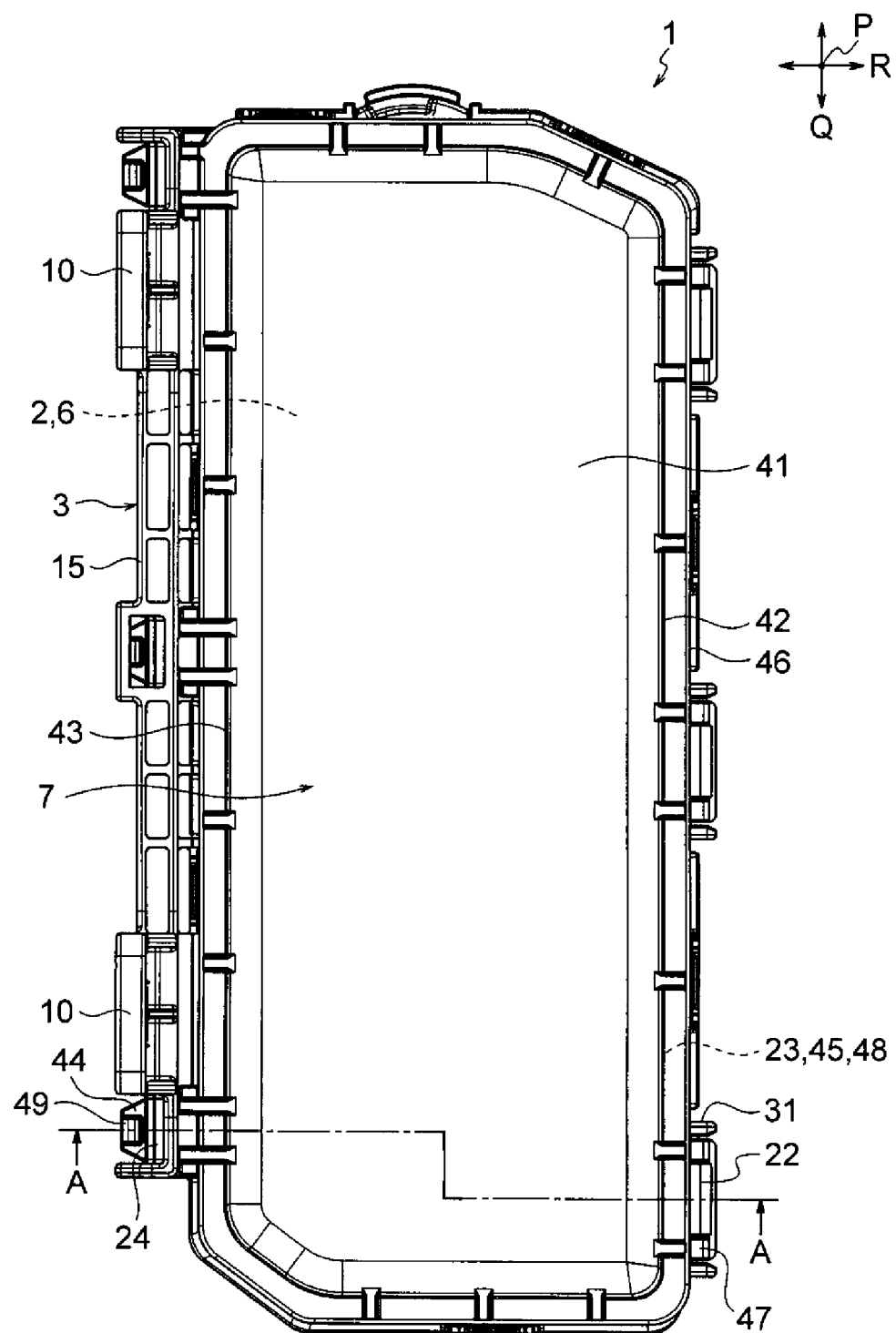
FIG. 2 is a plan view of the electrical connection box.
Figure 3:
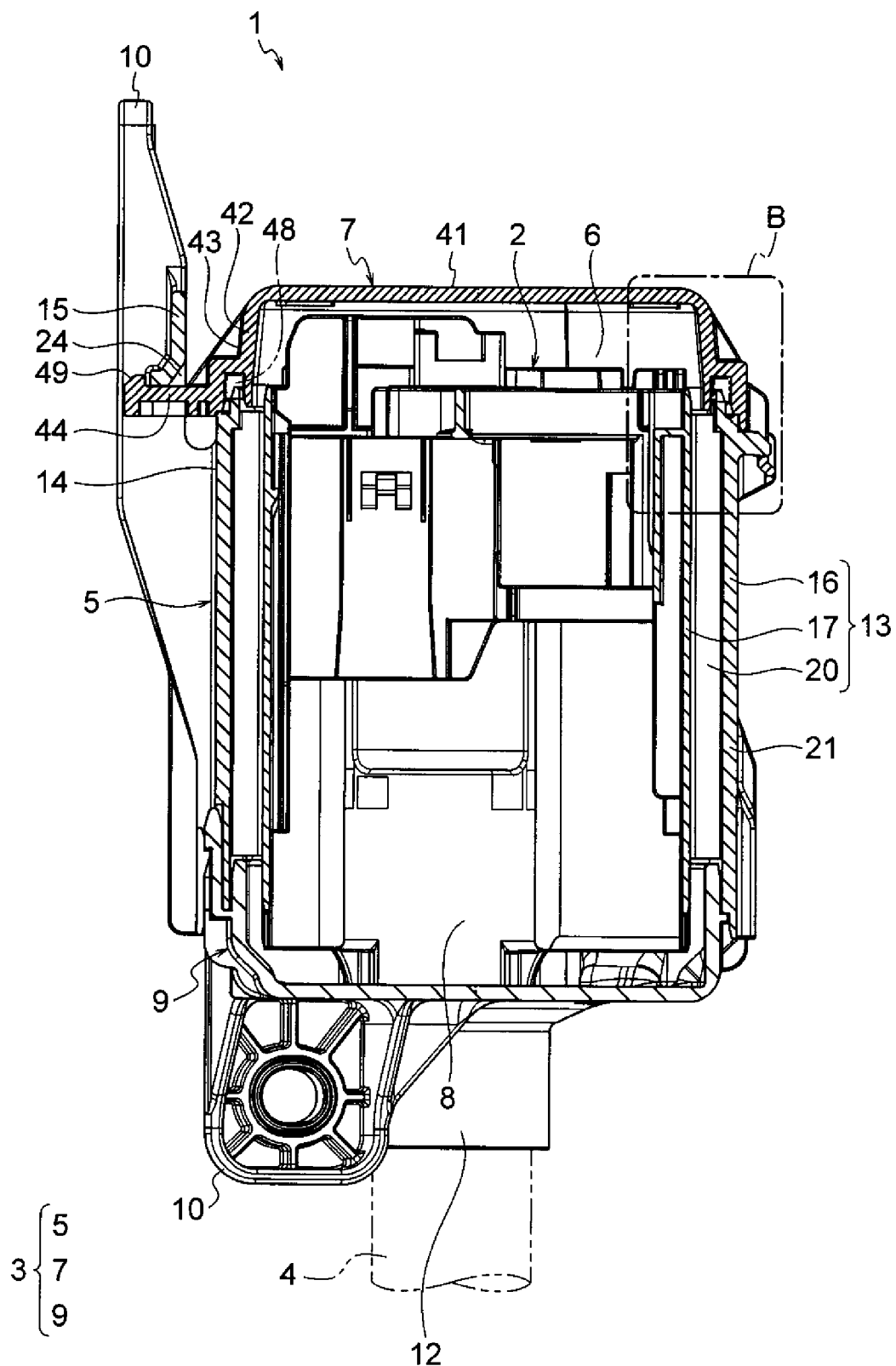
FIG. 3 is a cross-sectional view taken along line the A-A of FIG. 2.
Figure 4:
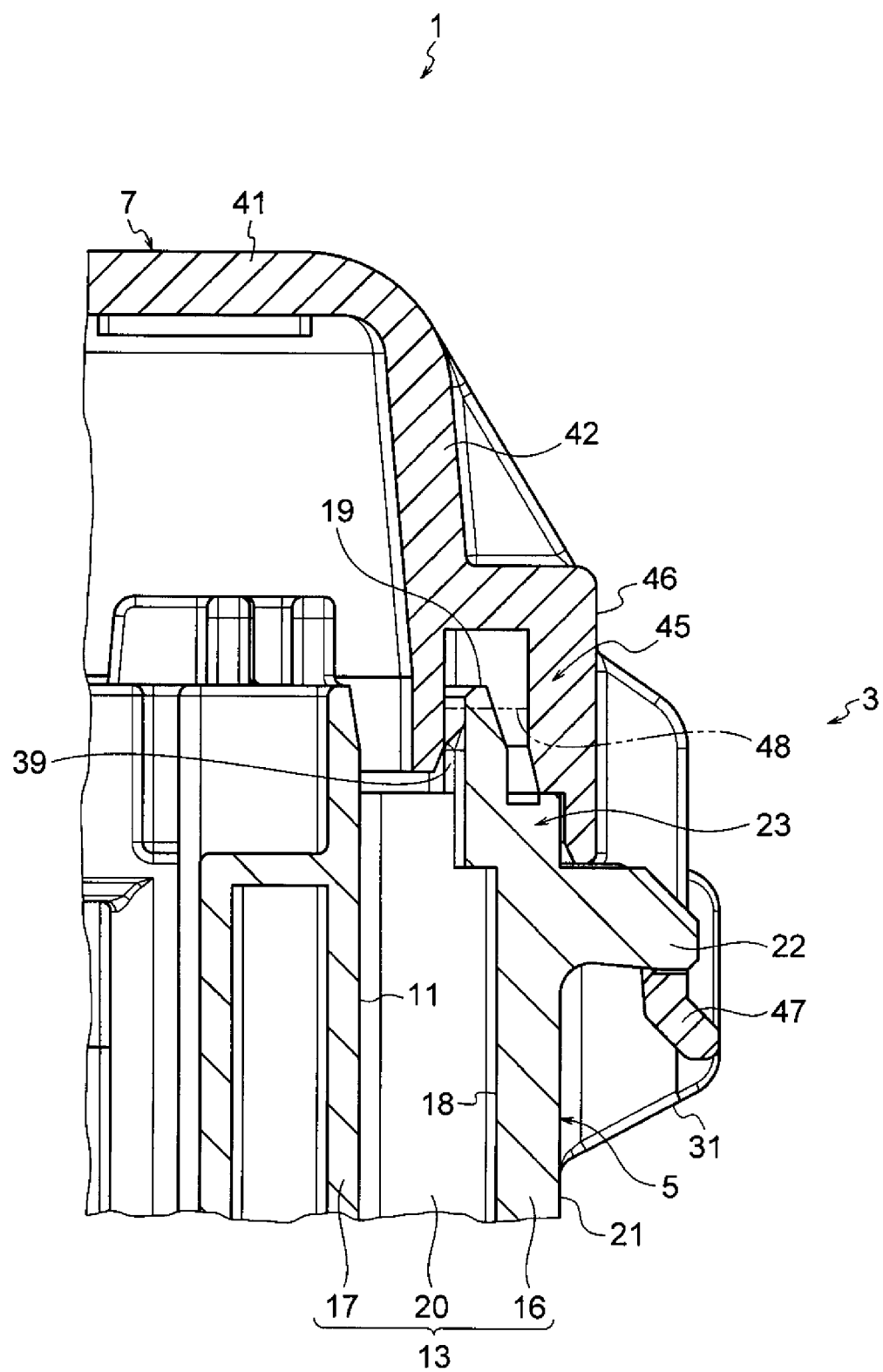
FIG. 4 is an enlarged view of the alternate long and short dashed line B of FIG.
Figure 5A:
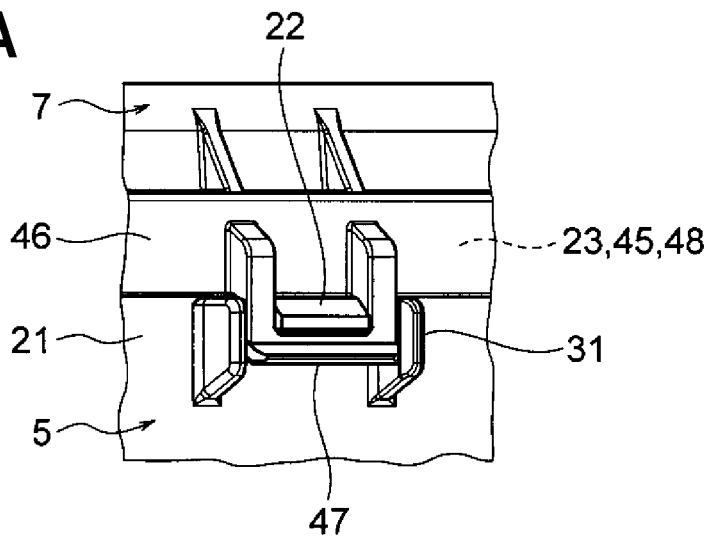
FIGS. 5A, 5B, and 5C are views of a fitting portion.
Figure 5B:
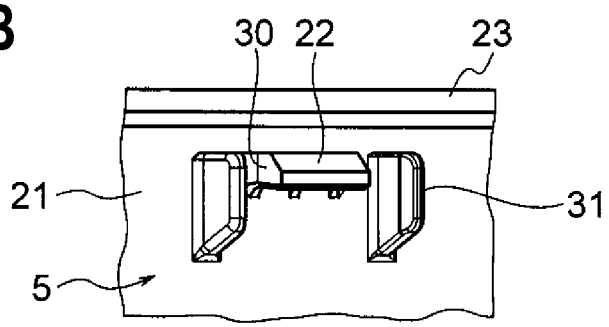
Figure 5C:
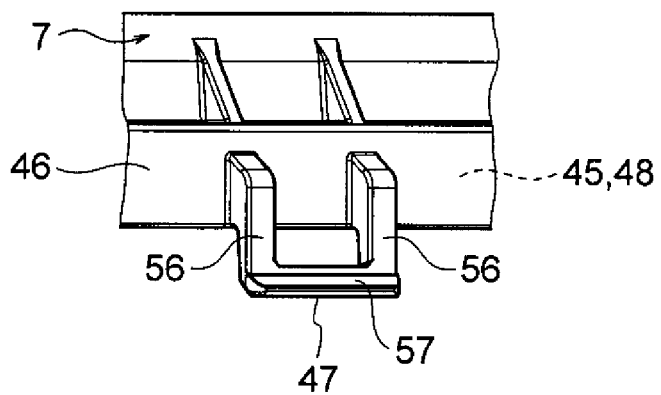
Figure 6:
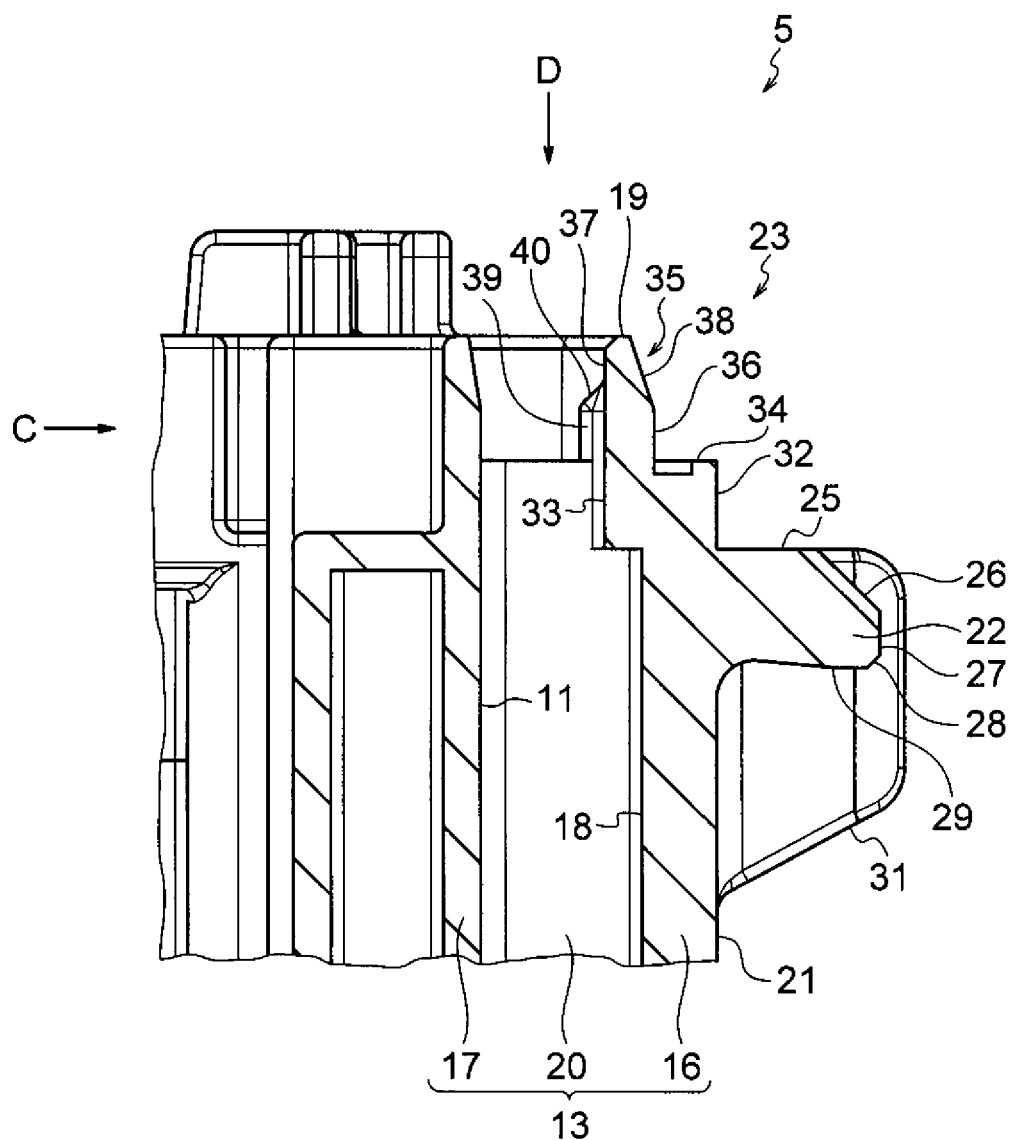
FIG. 6 is an enlarged cross-sectional view of a main part of a frame.
Figure 7A:
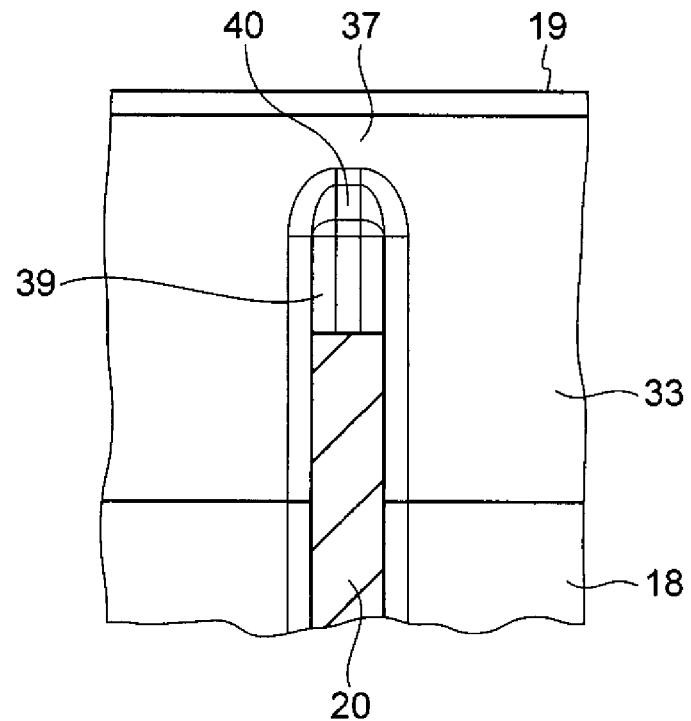
FIGS. 7A and 7B are views of a position adjusting portion.
Figure 7B:
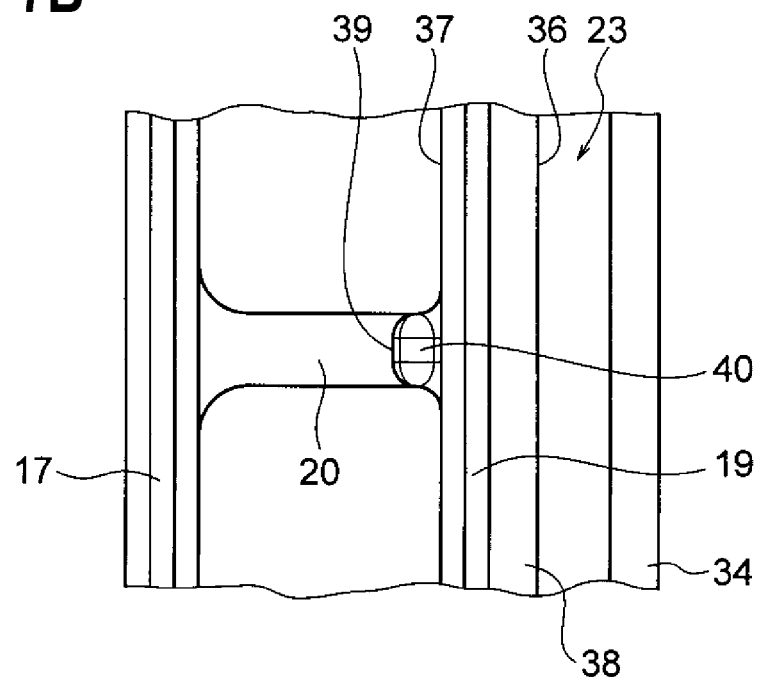
Figure 8:
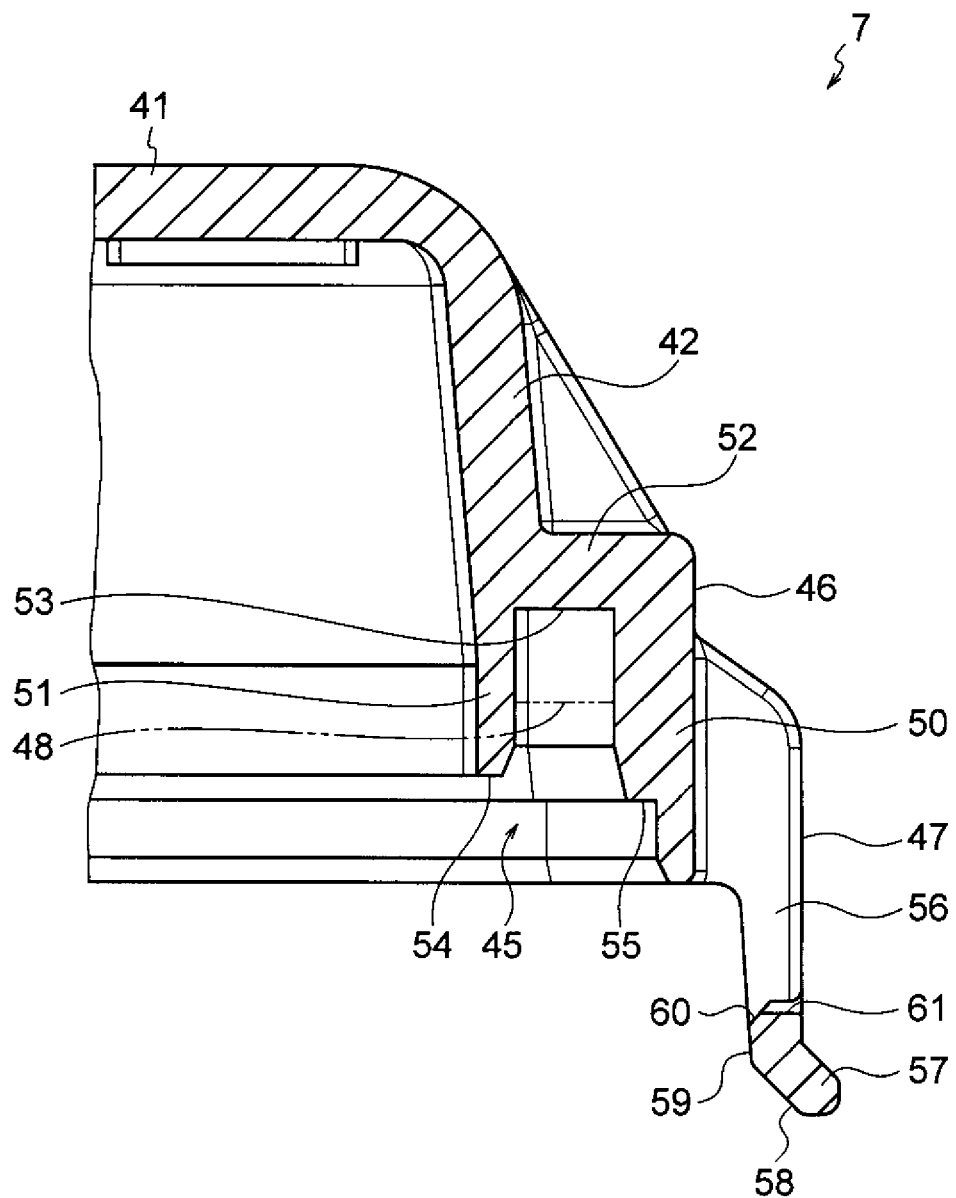
FIG. 8 is an enlarged cross-sectional view of a main part of an upper cover.
Figure 9:
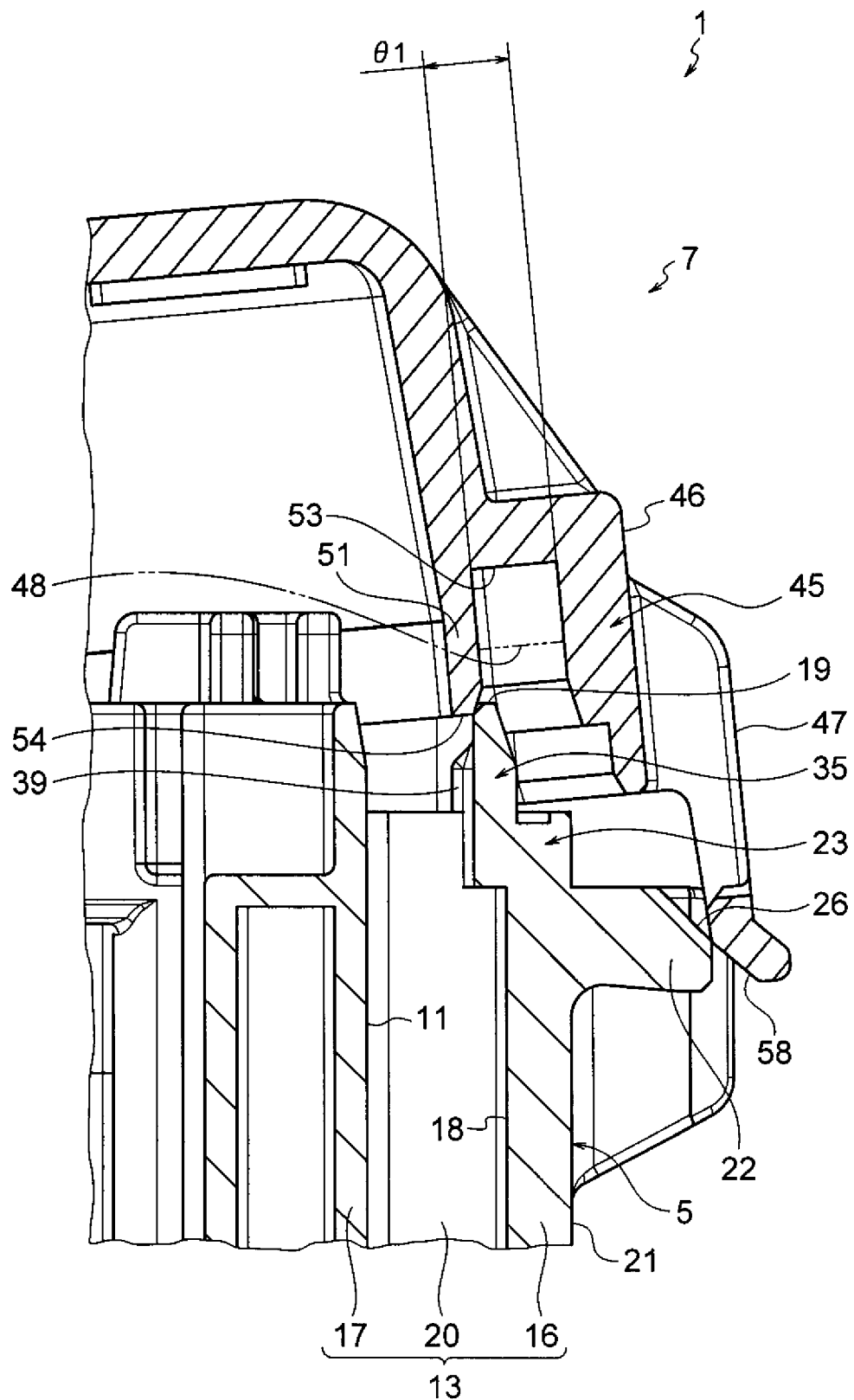
FIG. 9 is an enlarged cross-sectional view of the main part at the time of starting fitting.
Figure 10:
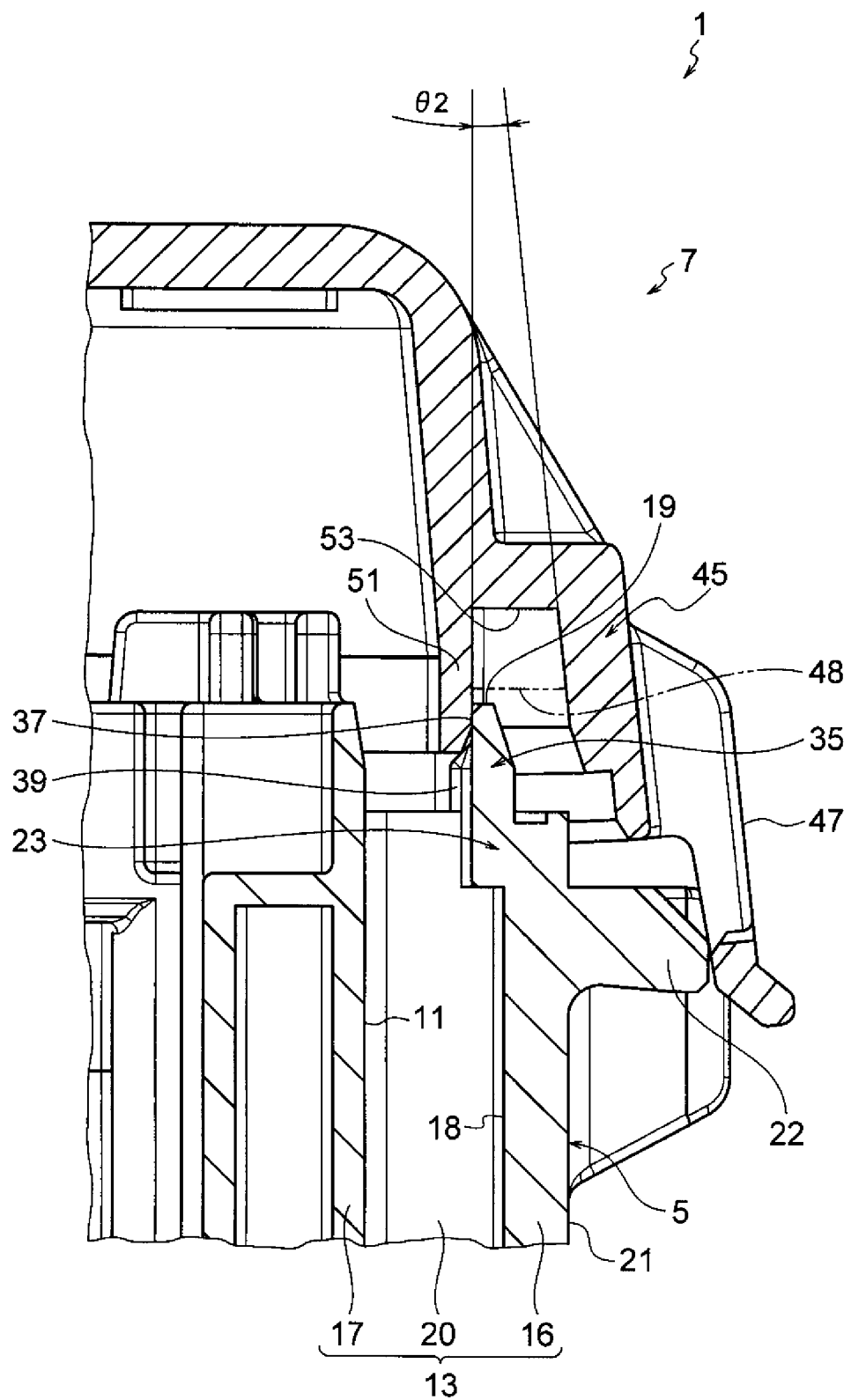
FIG. 10 is an enlarged cross-sectional view of the main part in the middle of fitting.
Figure 11:
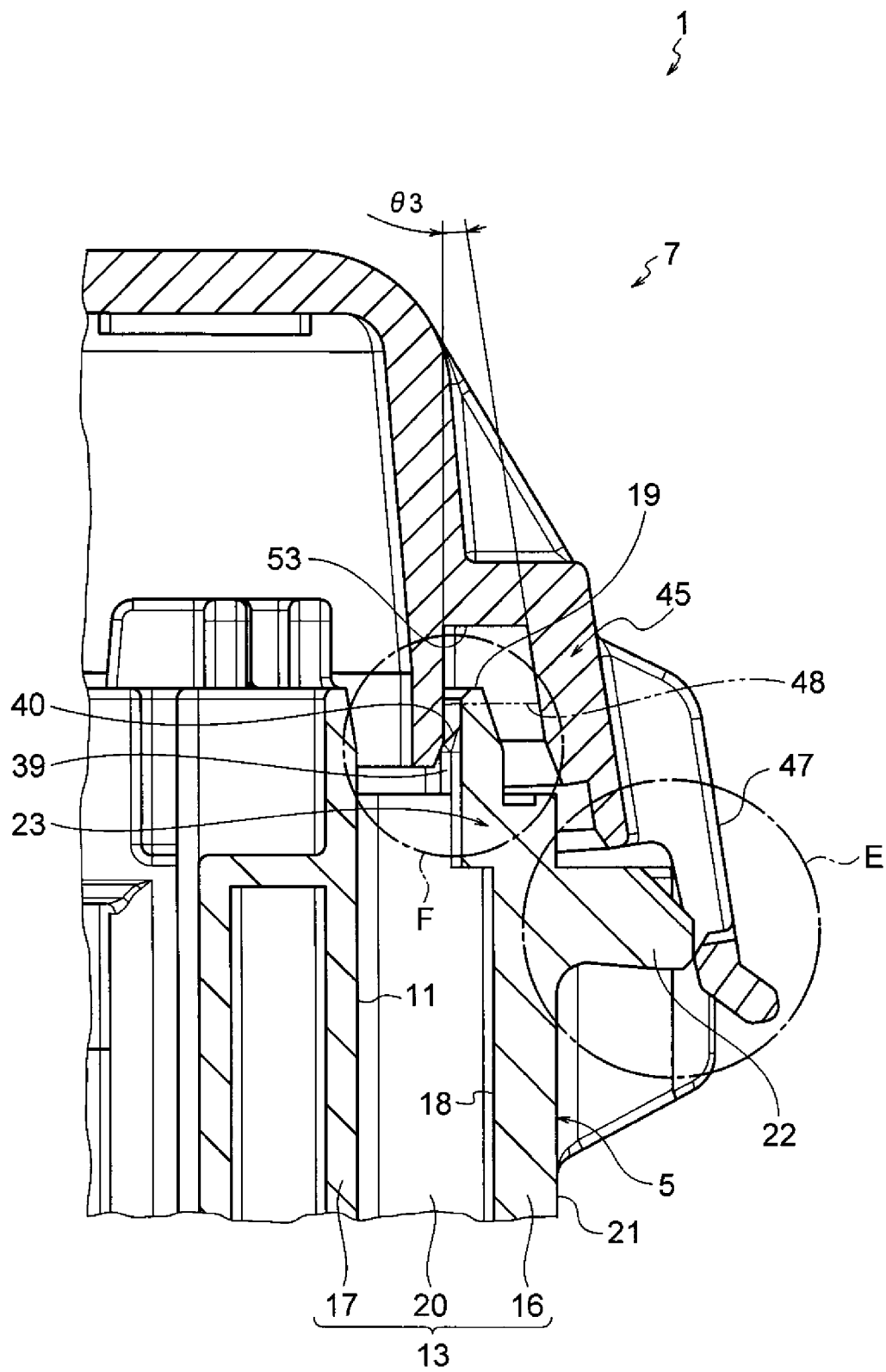
FIG. 11 is an enlarged cross-sectional view of the main part in the middle of fitting.
Figure 12:
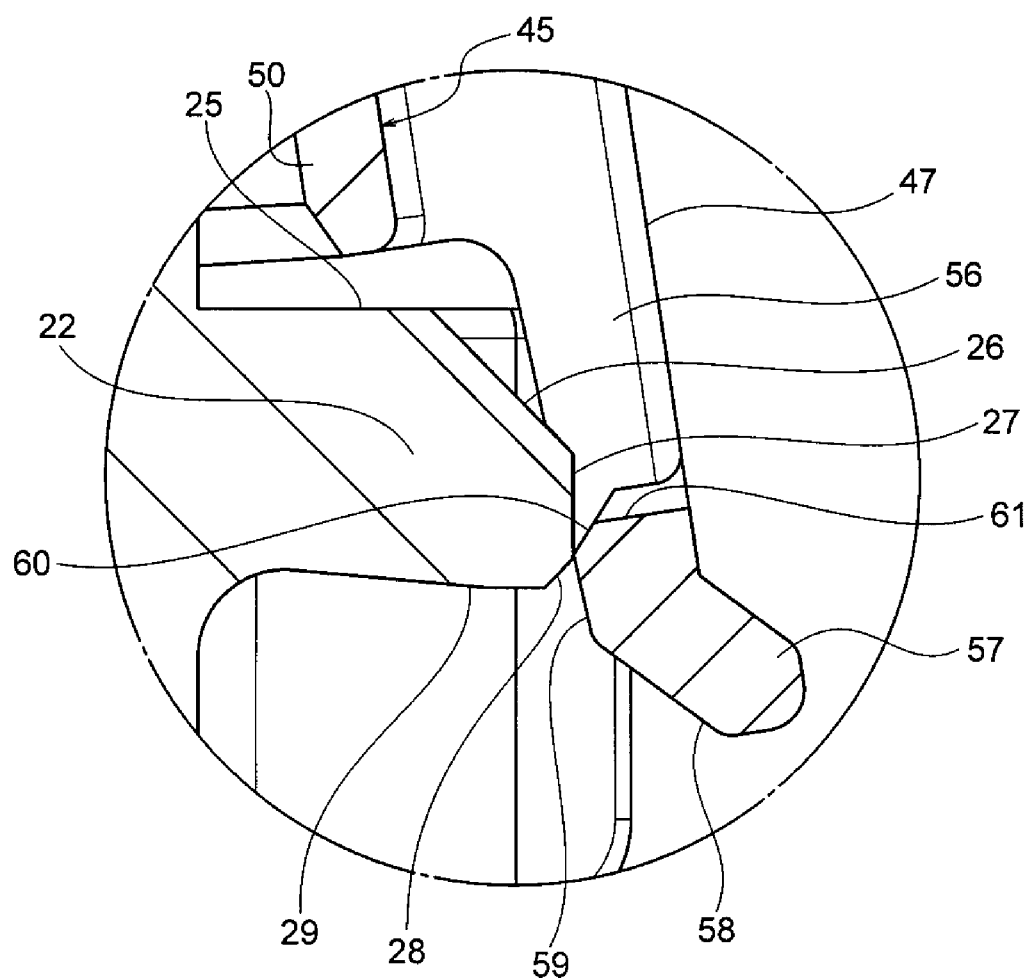
FIG. 12 is an enlarged view of the one-dot chain line circle E of FIG. 11.
Figure 13:
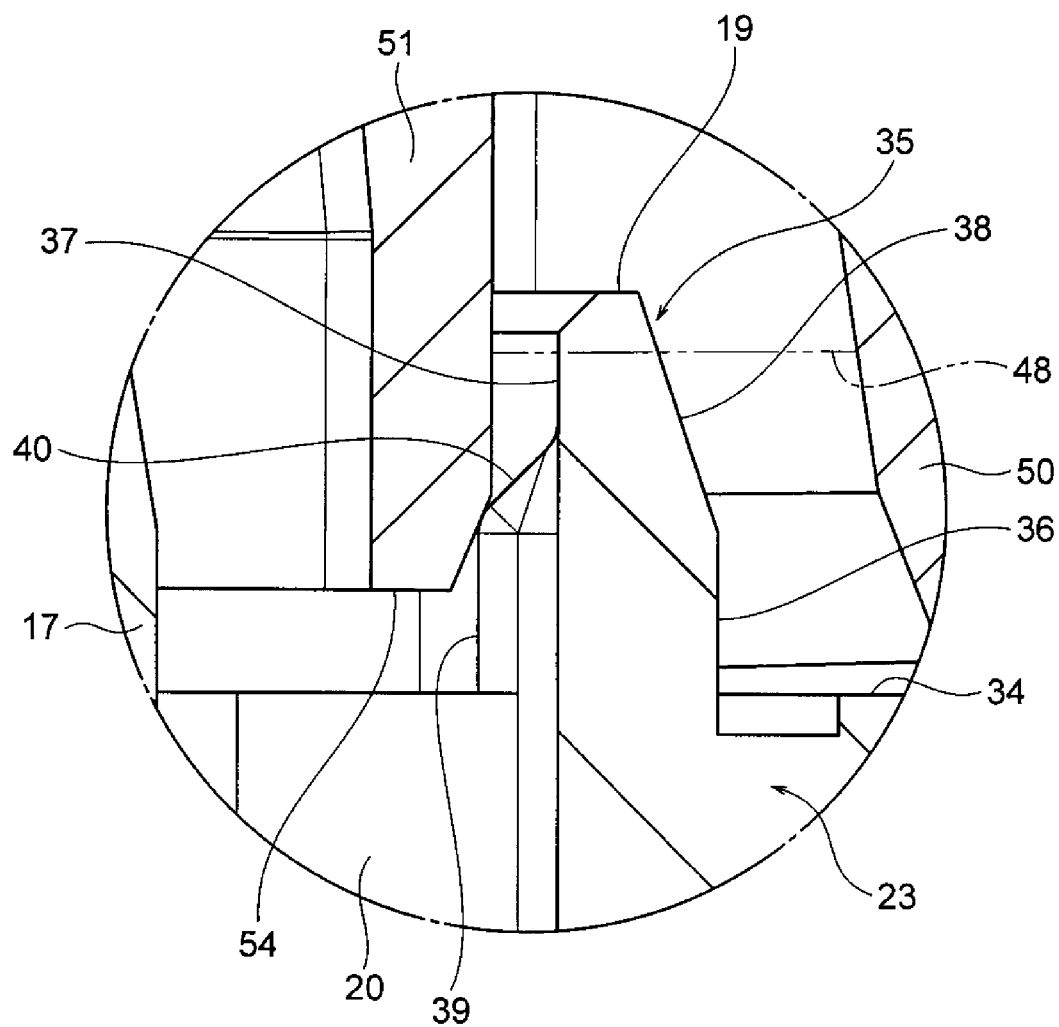
FIG. 13 is an enlarged view of the one-dot chain line circle F of FIG. 11.
Figure 14:
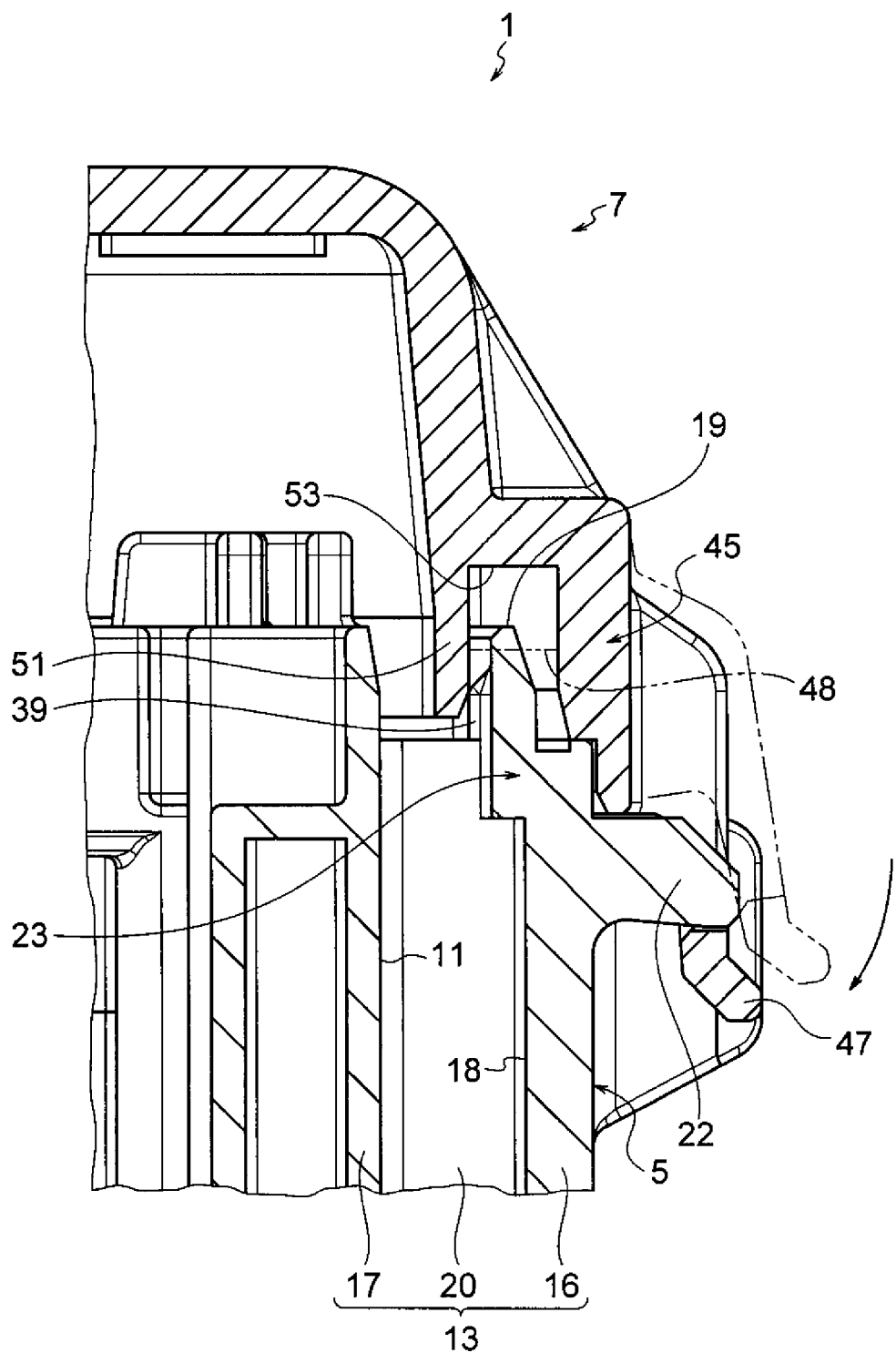
FIG. 14 is an enlarged cross-sectional view of the main part at the time of completing fitting.

Hereinafter, Example will be described with reference to drawings. FIG. 1 is a perspective views illustrating an embodiment of an electrical connection box including a casing of the present invention. FIG. 2 is a plan view of the electrical connection box, FIG. 3 is a cross-sectional view taken along line the A-A of FIG. 2, FIG. 4 is an enlarged view of the alternate long and short dashed line B of FIG. 3, FIGS. 5A, 5B, and 5C are views of a fitting portion, FIG. 6 is an enlarged cross-sectional view of a main part of a frame, FIGS. 7A and 7B are views of a position adjusting portion, FIG. 8 is an enlarged cross-sectional view of a main part of an upper cover, FIG. 9 is an enlarged cross-sectional view of the main part at the time of starting fitting, FIGS. 10 to 11 are enlarged cross-sectional views of the main part in the middle of fitting, FIG. 12 is an enlarged view of the one-dot chain line circle E of FIG. 11, FIG. 13 is an enlarged view of the one-dot chain line circle F of FIG. 11, and FIG. 14 is an enlarged cross-sectional view of the main part at the time of completing fitting. An arrow P in the drawing indicates a vertical direction, an arrow Q indicates a left-right direction, and an arrow R indicates a front-rear direction.

<Configuration of Electrical Connection Box 1>

In FIGS. 1 to 3, an electrical connection box 1 is mounted on a truck in an exposed state to the outside (assumed to be an example). Specifically, the electrical connection box is mounted between a cabin and a loading platform in the truck (assumed to be an example). The electrical connection box 1 is configured to include an electronic component block 2, a casing 3 for accommodating the electronic component block 2, and a packing 48 (see FIG. 4, described later) to be assembled to the casing 3. The electrical connection box 1 is configured so that a wire harness 4 is retracted into the casing 3 (the wire harness 4 is provided with the electrical connection box 1 at a predetermined position of this terminal or the like and is wired to an automobile).

As will be understood from the following description, the electrical connection box 1 has a structure for securing waterproof capability and airtightness, and the structure has characteristics.

<Electronic Component Block 2>

In FIG. 3, the electronic component block 2 is provided as a member to which a plurality of electronic components are assembled. The electronic component block 2 is provided as a member to which the electronic components are connected to a predetermined circuit. Specifically, a relay is assembled to a relay assembling portion (reference numeral omitted) made of resin, and a fuse is provided as a member to be assembled to a fuse assembling portion (reference numeral omitted) made of resin (the configuration of the electronic component block 2 is assumed to be an example).

The electronic component block 2 as described above is one of a cassette type and is detachably assembled to a frame 5 to be described later. For the electronic component block 2, this name may be read as a cassette block 2.

<Configuration of Casing 3>

In FIGS. 1 to 3, the casing 3 is a combination of members made of resin having insulation properties and specifically, is configured to include the frame 5 to which the electronic component block 2 is detachably assembled, an upper cover 7 (cover) for covering an upper opening portion 6 (opening portion) of the frame 5, and a lower cover 9 for covering a lower opening portion 8 of the frame 5. The casing 3 is provided with a pair of fixed leg portions 10 and a single fixed leg portion 10. The casing 3 is provided with an insertion portion 12 through which the wire harness 4 is inserted (retracted).

The upper opening portion 6 (opening portion) is an opening portion surrounded by an edge 19 of an outer peripheral wall 16 constituting a frame peripheral wall 13 to be described later. The upper opening portion 6 is an opening portion at a position on the upper side in the drawing and is also an opening portion on the side of the upper cover 7 (cover).

<Configuration of Frame 5>

In FIGS. 1 and 3, the frame 5 is a resin-molded product having a frame peripheral wall 13, a fixed base 15 provided on one side portion 14 of the frame peripheral wall 13, and the pair of fixed leg portions 10 provided on the fixed base 15 and is formed in the illustrated shape.

<Frame Peripheral Wall 13>

In FIGS. 1 and 3, the frame peripheral wall 13 has the outer peripheral wall 16 extending in the vertical direction of the arrow P and having this height, an inner peripheral wall 17 disposed inside the outer peripheral wall 16, and a plurality of connecting portions 20 for connecting an inner surface 18 of the outer peripheral wall 16 and an outer surface 11 of the inner peripheral wall 17 with a space therebetween. The outer peripheral wall 16 and the inner peripheral wall 17 are formed in a frame-shaped portion whose top and bottom are opened. The plurality of connecting portions 20 are formed in a rib shape extending in the vertical direction. As may be seen from the above, the frame peripheral wall 13 is formed with a double-wall structure. A position adjusting portion 39 (described later) is connected to the upper end (end portion) of a part of the plurality of connecting portions 20 (the position adjusting portion 39 is a characteristic part of the present invention).

The fixed base 15 is provided on one side portion 14 of the frame peripheral wall 13 as described above. Three frame-side locking portions 22 as fitting portions to the upper cover 7 are formed on the other side portion 21 to be the opposite side of one side portion 14 (the number of locking portions is assumed to be an example). In addition, a mounting portion (reference numeral omitted) for the electronic component block 2 is formed on the inner surface of the inner peripheral wall 17. At the upper end of the outer peripheral wall 16, a joint portion 23 is formed.

<Fixed Base 15 and Fixed Leg Portions 10>

In FIGS. 1 to 3, the fixed base 15 is provided on the upper side of one side portion 14 and is formed in a shape extending in the left-right direction. The fixed base 15 is disposed in accordance with the position of a rotation center of the upper cover 7. In such the fixed base 15, in addition to the pair of fixed leg portions 10, three protrusion engaging portions 24 are formed (the number of protrusion engaging portions is assumed to be an example).

<Protrusion Engaging Portion 24>

In FIGS. 2 to 4, the protrusion engaging portion 24 is formed in a portion of the upper cover 7 through which a protrusion 44 (described later) is inserted. The protrusion engaging portion 24 is also formed in a portion where the inserted protrusion 44 is in an engaged state. The state of engagement with the protrusion 44 is an engaged state in which the upper cover 7 may rotate and move.

<Frame-Side Locking Portion 22>

In FIGS. 3 to 6, the frame-side locking portion 22 is a portion for bringing the upper cover 7 into a fitted state with respect to the frame peripheral wall 13 and is formed in a protruding shape protruding outward (forward) from the other side portion 21 of the frame peripheral wall 13. An upper surface 25, a first guide surface 26, a tip end surface 27, a second guide surface 28, a lower surface 29 (locking surface), and a pair of side surfaces 30 are formed in the frame-side locking portion 22.

The upper surface 25 is formed so as to be perpendicular to the outer surface of the outer peripheral wall 16 (the other side portion 21 of the frame peripheral wall 13). The upper surface 25 is formed so as to extend along the front-rear direction. The first guide surface 26 is formed on the outer side of the upper surface 25 and is inclined obliquely downward. The first guide surface 26 is formed on a surface that allows a cover-side locking portion 47 (described later) to be opened outward while guiding the cover-side locking portion 47. The tip end surface 27 is formed on the surface to be positioned at the protruding tip end of the frame-side locking portion 22. The tip end surface 27 is formed such that the first guide surface 26 is continuous at this upper end and the second guide surface 28 is continuous at the lower end. The tip end surface 27 is formed in a plane parallel to the outer surface of the outer peripheral wall 16.

The second guide surface 28 is formed on a surface that guides the cover-side locking portion 47 when the cover-side locking portion 47 elastically returns to the original position. The second guide surface 28 is formed to be shorter than the first guide surface 26. The lower surface 29 is formed so as to be positioned on the opposite side of the upper surface 25. The lower surface 29 is formed on a surface not parallel to the upper surface 25. That is, the lower surface 29 is formed to be inclined obliquely upward from the second guide surface 28 toward the outer surface of the outer peripheral wall 16. In other words, the lower surface 29 is formed on a surface inclined so that a gap gradually increases from the second guide surface 28 to the outer surface of the outer peripheral wall 16 with respect to a locked surface 61 (described later) of the cover-side locking portion 47. The lower surface 29 is formed on a surface so that the frictional resistance with respect to the locked surface 61 is reduced (so as not to make contact between the surfaces).

The pair of side surfaces 30 are formed so as to be positioned on the left and right sides. Protective walls 31 are disposed and formed on the left and right sides of the pair of side surfaces 30 at proper intervals. The pair of protective walls 31 are formed so as to protect the fitting state between the frame-side locking portion 22 and the cover-side locking portion 47 to be described later from an external cause. In the present embodiment, the pair of protective walls 31 are formed in a wall-shaped portion protruding from the outer surface of the outer peripheral wall 16.

The frame-side locking portion 22 as described above is disposed and formed in the vicinity of the lower portion of the joint portion 23 to be described later.

<Joint Portion 23>

In FIGS. 4 and 6, the joint portion 23 is formed in a portion where the upper cover 7 is engaged. Specifically, the joint portion 23 is formed in a joint portion. The joint portion 23 is disposed and formed so as to be positioned at the upper end of the outer peripheral wall 16 as described above. An outer surface 32, an inner surface 33, an upper surface 34, and an edge portion 35 are formed in such the joint portion 23.

The outer surface 32 is formed so as to be at the same position as the outer surface of the outer peripheral wall 16. When the cover-side locking portion 47 (described later) elastically returns, the outer surface 32 at the portion where the frame-side locking portion 22 is present is formed on such a surface that the cover-side locking portion 47 abuts and a large fitting sound is generated by the impact. The inner surface 33 is formed so as to be positioned inside the inner surface 18 of the outer peripheral wall 16. The inner surface 33 is formed so as to be parallel to the outer surface 32, the inner surface 18 of the outer peripheral wall 16, and the outer surface 11 of the inner peripheral wall 17. With respect to the inner surface 33, an edge portion inner surface 37 (described later) of the edge portion 35 is formed to be continuous.

In the present embodiment, the upper surface 34 is disposed in accordance with the position of the upper end (end portion) of the connecting portion 20. On the upper surface 34, the edge portion 35 having a shape protruding upward is connected. The edge portion 35 is formed in a portion which may be elastically deformed when pressed against the packing 48 (described later) to be assembled to a joint portion 45 (described later) of the upper cover 7. The edge 19, an edge portion outer surface 36, the edge portion inner surface 37, an inclined surface 38, and the position adjusting portion 39 are formed in the edge portion 35.

The edge 19 is formed in a portion where an inner wall 51 may be guided inward when the inner wall 51 of the joint portion 45 (described later) of the upper cover 7 abuts. The edge 19 is formed in a portion where the packing 48 (described later) of the upper cover 7 is pressed. The edge portion outer surface 36 is formed so as to be disposed inside the outer surface 32 of the joint portion 23 by an amount corresponding to the upper surface 34. In the present embodiment, the edge portion outer surface 36 is disposed slightly outside the inner surface 18 of the outer peripheral wall 16. The inclined surface 38 is formed as an inclined surface connecting the edge portion outer surface 36 and the edge 19. The edge portion inner surface 37 is formed in a plane that is continuous in the same plane with the inner surface 33 of the joint portion 23.

<Position Adjusting Portion 39>

In FIGS. 4, 6, 7A, and 7B, the position adjusting portion 39 is a characteristic part of the present invention and is connected to the edge portion inner surface 37. The position adjusting portion 39 is connected to the upper end (end portion) of the connecting portion 20. The position adjusting portion 39 is formed in a rib shape having a semicircular cross section (extending to the edge 19) protruding upward with the width of the connecting portion 20 (this is taken as an example). The position adjusting portion 39 as described above is formed so that the inner wall 51 of the joint portion 45 (described later) of the upper cover 7 may be returned to the inside (described later). The position adjusting portion 39 is formed so that the position of an packing groove 53 of the joint portion 45 (described later) may be adjusted with respect to the edge 19 by trying to return the inner wall 51 of the joint portion 45 to the inside (in other words, the position adjusting portion 39 is formed so that the center position of the packing 48, for example, is reliably pressed against the edge 19). A taper 40 is formed at the tip end of the position adjusting portion 39 as a portion for guiding the inner wall 51 of the joint portion 45.

The position adjusting portion 39 is disposed at least in accordance with the position of the frame-side locking portion 22. Regarding this disposition, even if the joint portion 45 (described later) of the upper cover 7 tries to move outward due to the elastic deformation of the cover-side locking portion 47 to be described later, the disposition is not particularly limited as long as the movement may be restricted to prevent positional misalignment. The position adjusting portion 39 of the present embodiment is disposed in accordance with the base end positions of a pair of arm portions 56 (described later) of the cover-side locking portion 47 to be fitted into the frame-side locking portion 22.

Since the position adjusting portion 39 of the present embodiment protrudes upward with the width of the connecting portion 20, it is a matter of course that the structure of the molding die is not complicated. Since the position adjusting portion 39 of the present embodiment is rib-shaped and substantially small and is disposed in accordance with the position of the frame-side locking portion 22, it is a matter of course that the resin material to be used is small and the influence of cost is small. It is also possible to thicken the edge portion inner surface 37 as a whole to make the edge portion inner surface 37 to be the position adjusting portion 39, but since the resin material to be used increases, in this case, it is understood that the position adjusting portion 39 in the shape and disposition as in the present embodiment is preferable.

<Configuration of Upper Cover 7 (Cover)>

In FIGS. 1 to 3, the upper cover 7 is a resin-molded product for covering the upper opening portion 6 (opening portion) of the frame 5 as described above, having a ceiling wall 41, a cover peripheral wall 42 continuous to the peripheral edge of the ceiling wall 41, three protrusions 44 to be provided on one side portion 43 of the cover peripheral wall 42 (the number of protrusions is assumed to be an example), the joint portion 45 to be provided at the lower end of the cover peripheral wall 42, and three cover-side locking portions 47 to be provided on the other side portion 46 on the opposite side of one side portion 43 (the number of cover-side locking portions is assumed to be an example) and is formed in the illustrated shape. As may be seen from the drawing, the upper cover 7 is a separate member from the frame 5.

<Packing 48>

In FIG. 4, the packing 48 for ensuring waterproof capability (airtightness) is assembled to the upper cover 7. Specifically, the packing 48 is assembled to the joint portion 45 to be described later. The packing 48 is a seal member made of rubber or elastomer and is formed in an annular shape. The cross section of the packing 48 is formed in a rectangular shape.

<Protrusion 44>

In FIGS. 2 and 3, the three protrusions 44 are disposed and formed in accordance with the positions of the three protrusion engaging portions 24 of the frame peripheral wall 13. The three protrusions 44 are disposed and formed in accordance with the position of the rotational center of the upper cover 7 when the upper cover rotates and moves as described later. When the three protrusions 44 are inserted into the three protrusion engaging portions 24 of the frame peripheral wall 13, the protrusions 44 themselves are formed in a portion where the protrusions 44 are in the above-described engaged state. On the protrusion 44, a convex portion 49 is formed. Even if the protrusion 44 is about to fall off the protrusion engaging portion 24, the convex portion 49 is formed in a falling-off preventing portion which is hooked on the protrusion engaging portion 24.

<Joint Portion 45>

In FIGS. 3, 4, and 8, the joint portion 45 is formed in a portion to be engaged with the joint portion 23 of the frame peripheral wall 13. As described above, the joint portion 45 is disposed and formed so as to be positioned at the lower end of the cover peripheral wall 42. An outer wall 50, the inner wall 51, a ceiling wall 52, and the packing groove 53 are formed in the joint portion 45. The joint portion 45 is formed in a portion having a U-shaped cross section as illustrated. The packing groove 53 is formed so as to be surrounded by the outer wall 50, the inner wall 51, and the ceiling wall 52. The packing groove 53 is formed in a portion to which the packing 48 is assembled. The packing groove 53 is formed in a deep bottom groove such that the packing 48 does not protrude from an end portion 54 of the inner wall 51. When the upper cover 7 is rotated and moved, the packing groove 53 is inserted into the edge portion 35 of the frame peripheral wall 13 and then formed in a groove such that the packing 48 is pressed against the edge 19 of the edge portion 35. On the tip end side of the outer wall 50, a step portion 55 is formed. The step portion 55 is formed in a portion corresponding to the outer surface 32 and the upper surface 34 of the joint portion 23 of the frame peripheral wall 13. On the outer surface of the outer wall 50, the cover-side locking portion 47 is connected.

<Cover-Side Locking Portion 47>

In FIGS. 3 to 5A, 5B, and 5C, and 8, the cover-side locking portion 47 is a portion to be fitted into the frame-side locking portion 22 of the frame peripheral wall 13 and has the pair of arm portions 56 and a locked portion 57 to be formed in a U shape. The base end portions of the pair of arm portions 56 are respectively connected to the outer surface of the outer wall 50 at the joint portion 45 of the upper cover 7. The pair of arm portions 56 are formed in an arm-shaped portion (rib-shaped portion) such that the tip end portions of the pair of arm portions 56 extend downward.

The locked portion 57 is formed in a portion extending in the left-right direction so as to connect the tip end portions of the pair of arm portions 56. A first sliding contact surface 58, a second sliding contact surface 59, a third sliding contact surface 60, and the locked surface 61 are formed in such the locked portion 57. The first sliding contact surface 58 is formed on a surface which slidably contacts the first guide surface 26 of the frame-side locking portion 22. The second sliding contact surface 59 is formed on a surface which slidably contacts the tip end surface 27 of the frame-side locking portion 22. The third sliding contact surface 60 is formed on a surface which slidably contacts the tip end surface 27 of the frame-side locking portion 22 and the continuous portion of the second guide surface 28. The locked surface 61 is formed on a surface to be locked to the frame-side locking portion 22. As described above, the locked surface 61 is formed on a surface which does not make contact with the lower surface 29 (locking surface) of the frame-side locking portion 22.

<Assembling of Upper Cover 7>

The assembling of the upper cover 7 will be described below with reference to FIGS. 9 to 14.

In FIG. 9, assembling of the upper cover 7 is started by setting the upper cover 7 in an oblique state and then, inserting the protrusion 44 (see FIG. 3) of the upper cover 7 into the protrusion engaging portion 24 (see FIG. 3) of the frame peripheral wall 13. The protrusion 44 is inserted into the protrusion engaging portion 24 to be engaged, and the center of rotation of the upper cover 7 is generated in the vicinity of this engaged portion.

Next, when the upper cover 7 is rotated (in the case of FIG. 9, rotated in the clockwise direction), at the side where the other side portion 21 of the frame peripheral wall 13 and the other side portion 46 of the upper cover 7 are present, engagement of the joint portion 45 of the upper cover 7 with respect to the joint portion 23 of the frame peripheral wall 13 is started. Fitting of the cover-side locking portion 47 of the upper cover 7 with respect to the frame-side locking portion 22 of the frame peripheral wall 13 is also started. Specifically, the end portion 54 of the inner wall 51 of the joint portion 45 abuts against the edge 19 of the edge portion 35 of the joint portion 23, and the engagement is started. The first sliding contact surface 58 of the cover-side locking portion 47 slidably contacts the first guide surface 26 of the frame-side locking portion 22, and fitting is also started. At the start of engagement, the packing 48 is not yet pressed against the edge 19. In the state of FIG. 9, the inner surface of the groove of the packing groove 53 is substantially parallel, and the elastic deformation is very small (the angle at this time is assumed to be θ1).

In FIG. 10, when the upper cover 7 is further rotated and moved, the engagement progresses in a state where the inner wall 51 of the joint portion 45 slidably contacts the edge portion inner surface 37 of the edge portion 35 of the joint portion 23. Fitting also progresses in a state where the second sliding contact surface 59 (see FIG. 8) of the cover-side locking portion 47 slidably contacts the continuous portion of the first guide surface 26 and the tip end surface 27 (see FIG. 6) of the frame-side locking portion 22. In the state of FIG. 10, the packing 48 is not yet pressed against the edge 19 (or just in contact with the edge 19). In the state of FIG. 10, since a force that causes the cover-side locking portion 47 to be pulled outward acts, elastic deformation begins to occur such that the distance between the inner surfaces of the grooves of the packing groove 53 slightly increases (the angle at this time is assumed to be θ2, θ2>θ1).

In FIGS. 11 to 13, when the upper cover 7 is further rotated and moved, the engagement progresses in a state where the inner wall 51 of the joint portion 45 is guided by the taper 40 of the position adjusting portion 39 of the joint portion 23. Fitting also progresses in a state where the continuous portion of the second sliding contact surface 59 and the third sliding contact surface 60 of the cover-side locking portion 47 comes to the position of the continuous portion of the tip end surface 27 and the second guide surface 28 of the frame-side locking portion 22. In the state of FIGS. 11 to 13, the packing 48 is pressed against the edge 19 and is in a state of being elastically deformed. In the state of FIGS. 11 to 13, since a force that causes the cover-side locking portion 47 to be pulled outward acts, or a force that causes the inner wall 51 of the joint portion 45 to be pulled inward by being guided by the taper 40 of the position adjusting portion 39 of the joint portion 23 also acts, the distance between the inner surfaces of the grooves of the packing groove 53 increases in a substantially chevron shape (the angle at this time is assumed to be θ3, θ3>θ2>θ1).

In FIG. 14, when the upper cover 7 is further rotated and moved, the cover-side locking portion 47 elastically returns to the original state at once, the cover-side locking portion 47 is fitted into the frame-side locking portion 22, and the fitting is completed. At this time, due to the movement of the cover-side locking portion 47, the cover-side locking portion 47 is struck against the side of the frame peripheral wall 13, and a comparatively large fitting sound called "snap" is generated. Due to the movement of the cover-side locking portion 47, since the inner wall 51 of the joint portion 45 is guided to the position adjusting portion 39 of the joint portion 23, whereby the joint portion 45 moves inward, and the packing 48 is pressed against the edge 19 at this center position. As described above, the joint portion 45 and the joint portion 23 are engaged with each other, and the assembling of the upper cover 7 is completed.

<Effect of Casing 3>

As described above with reference to FIGS. 1 to 14, according to the casing 3 of the electrical connection box 1 which is one embodiment of the present invention, since the position adjusting portion 39 adjusts the position of the packing groove 53 of the upper cover 7 with respect to the edge 19 of the frame peripheral wall 13, the center position of the packing 48 to be assembled in the packing groove 53 may be reliably pressed against the edge 19 of the frame peripheral wall 13. Therefore, the casing 3 may secure waterproof capability and airtightness.

According to the casing 3, since the position adjusting portion 39 is disposed and formed in accordance with the positions of the frame-side locking portion 22 and the cover-side locking portion 47, the position of the packing groove 53 of the upper cover 7 with respect to the edge 19 of the frame peripheral wall 13 may be adjusted even if the upper cover is affected by the fitting (in a case where the force due to the elastic deformation acts on the misalignment direction of the upper cover 7). Therefore, it is possible to reliably press the center position of the packing 48 to be assembled in the packing groove 53 against the edge 19 of the frame peripheral wall 13, thereby ensuring waterproof capability and airtightness.

According to the casing 3, since the locking surface (lower surface 29) of the frame-side locking portion 22 and the locked surface 61 of the cover-side locking portion 47 do not slidably contact to each other, it is possible to reduce the frictional resistance when the cover-side locking portion 47 elastically returns. As a result, the cover-side locking portion 47 may be elastically returned at once, and as a result, it is possible for an operator to recognize that the engagement is reliably performed by generating a large fitting sound. If it is recognized that the engagement is reliably performed, it is possible not only to improve workability but also to improve reliability by preventing half fitting.

Besides this, since the above effect of the casing 3 may be obtained, it is possible to provide the better electrical connection box 1 and the wire harness 4.

It goes without saying that the present invention may be variously modified within a range not changing the gist of the present invention.

What is claimed is:

1. A casing comprising:
a frame peripheral wall on which an opening portion is formed at an edge;
a cover that covers the opening portion by rotational movement; and
a packing that is assembled in a packing groove to be formed in the cover and is pressed against the edge during the rotational movement,
wherein a position adjusting portion for adjusting a position of the packing groove with respect to the edge is formed on an inner surface of the frame peripheral wall.

2. A casing comprising:
a frame peripheral wall on which an opening portion is formed at an edge;
a cover that covers the opening portion by rotational movement; and
a packing that is assembled in a packing groove to be formed in the cover and is pressed against the edge during the rotational movement,
wherein a position adjusting portion for adjusting a position of the packing groove with respect to the edge is formed on the frame peripheral wall,
the frame peripheral wall includes an outer peripheral wall having the edge and an inner peripheral wall to be disposed inside the outer peripheral wall, and a connecting portion that connects an inner surface of the outer peripheral wall and an outer surface of the inner peripheral wall with a space therebetween, and
the position adjusting portion is disposed and formed so as to be continuous to an end portion of the connecting portion and the inner surface of the outer peripheral wall.

3. The casing according to claim 2, wherein
the position adjusting portion is formed in a rib shape extending from the connecting portion toward the edge, and a taper as a guide portion is formed at a tip end thereof.

4. A casing comprising:
a frame peripheral wall on which an opening portion is formed at an edge;
a cover that covers the opening portion by rotational movement; and
a packing that is assembled in a packing groove to be formed in the cover and is pressed against the edge during the rotational movement,
wherein a position adjusting portion for adjusting a position of the packing groove with respect to the edge is formed on the frame peripheral wall, and
the position adjusting portion is disposed and formed in accordance with the positions of a frame-side locking portion as a fitting portion of the frame peripheral wall and a cover-side locking portion as a fitting portion of the cover.

5. The casing according to claim 4, wherein
the frame-side locking portion is formed in a protruding shape protruding outward,
the cover-side locking portion is formed in a substantially U-shaped frame shape to be locked by climbing over the frame-side locking portion in the protruding shape at the time of the rotational movement, and
a locking surface of the frame-side locking portion is formed in a shape inclined with respect to a locked surface of the cover-side locking portion so that a gap increases from a tip end to a base end of the frame-side locking portion.

6. An electrical connection box comprising:
   an electronic component block to which a plurality of electronic components are assembled; and
   the casing according to claim 1 to be an assembly destination of the electronic component block.

7. A wire harness wired to a vehicle comprising the electrical connection box according to claim 6 at a terminal.

8. The casing according to claim 1, wherein
   an outer surface of the frame peripheral wall, opposite from the inner surface, includes a frame-side locking portion as a fitting portion of the frame peripheral wall, and
   the cover includes a cover-side locking portion as a fitting portion of the cover that locks with the frame-side locking portion.

* * * * *